US009129942B2

(12) United States Patent
Blackshear

(10) Patent No.: US 9,129,942 B2
(45) Date of Patent: Sep. 8, 2015

(54) METHOD FOR SHAPING A LAMINATE SUBSTRATE

(75) Inventor: Edmund D. Blackshear, Wappingers Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 400 days.

(21) Appl. No.: 13/488,685

(22) Filed: Jun. 5, 2012

(65) Prior Publication Data

US 2013/0320578 A1 Dec. 5, 2013

(51) Int. Cl.
*B29C 51/46* (2006.01)
*H01L 21/48* (2006.01)
*H01L 21/683* (2006.01)
*H01L 23/00* (2006.01)

(52) U.S. Cl.
CPC ........ *H01L 21/4803* (2013.01); *H01L 21/6835* (2013.01); *H01L 24/81* (2013.01); *H01L 2221/68345* (2013.01); *H01L 2224/131* (2013.01); *H01L 2224/16227* (2013.01); *H01L 2224/81192* (2013.01); *H01L 2924/3511* (2013.01)

(58) Field of Classification Search
CPC .............. H01L 21/00; B29C 45/14065; B29C 2791/001
USPC ................... 264/241, 248–249, 263, 319, 327
See application file for complete search history.

(56) References Cited

U.S. PATENT DOCUMENTS

| | | | |
|---|---|---|---|
| 3,492,547 A * | 1/1970 | Recko et al. | 257/695 |
| 5,146,981 A * | 9/1992 | Samarov | 165/185 |
| 5,461,774 A | 10/1995 | Holmes et al. | |
| 5,665,631 A | 9/1997 | Lee et al. | |
| 5,667,391 A * | 9/1997 | Szczesny et al. | 439/79 |
| 6,292,369 B1 | 9/2001 | Daves et al. | |
| 6,770,961 B2 | 8/2004 | Lee | |
| 6,900,073 B2 | 5/2005 | Bezama et al. | |
| 6,986,191 B2 | 1/2006 | White | |
| 7,214,548 B2 | 5/2007 | Fayaz et al. | |
| 7,621,762 B2 | 11/2009 | Liaw | |
| 7,695,287 B2 | 4/2010 | Smith et al. | |
| 7,841,078 B2 | 11/2010 | Lam et al. | |
| 7,868,467 B2 * | 1/2011 | Lee et al. | 257/783 |
| 7,977,206 B2 | 7/2011 | Yamazaki | |
| 2001/0045686 A1* | 11/2001 | Thummel | 264/272.14 |
| 2003/0022402 A1* | 1/2003 | Takano | 438/14 |
| 2004/0168767 A1* | 9/2004 | Kanno et al. | 156/345.27 |
| 2006/0163330 A1 | 7/2006 | Chapman et al. | |
| 2007/0026544 A1* | 2/2007 | Tsuno | 438/14 |

(Continued)

FOREIGN PATENT DOCUMENTS

| | | |
|---|---|---|
| JP | 01-170089 | 7/1989 |
| JP | 01-272189 | 10/1989 |

(Continued)

*Primary Examiner* — Nahida Sultana
(74) *Attorney, Agent, or Firm* — Matthew Zehrer; Joseph Petrokaitis

(57) ABSTRACT

A method for shaping a laminate substrate includes characterizing the laminate substrate for warpage characteristics over a range of temperatures. The laminate substrate is placed into a shaping fixture with any necessary correction to obtain a flat laminate substrate chip site area at a chip join temperature. The laminate substrate is shaped at a temperature greater than or equal to a maximum laminate substrate fabrication temperature. The shape of the laminate substrate is retained when it is removed from the shaping fixture.

18 Claims, 17 Drawing Sheets

(56) References Cited

U.S. PATENT DOCUMENTS

| | | | |
|---|---|---|---|
| 2007/0046587 A1* | 3/2007 | Takahara | 345/76 |
| 2007/0049155 A1* | 3/2007 | Moro et al. | 445/24 |
| 2010/0055815 A1* | 3/2010 | Kim et al. | 438/29 |
| 2010/0177165 A1* | 7/2010 | Oh et al. | 348/46 |
| 2011/0147933 A1* | 6/2011 | Wu et al. | 257/741 |
| 2012/0098115 A1* | 4/2012 | Watanabe | 257/690 |
| 2014/0265094 A1* | 9/2014 | Kobashi et al. | 269/21 |

FOREIGN PATENT DOCUMENTS

| | | |
|---|---|---|
| JP | 02-116550 | 1/1990 |
| JP | 02-116551 | 5/1990 |
| JP | 03-016731 | 1/1991 |
| JP | 03-239528 | 10/1991 |
| JP | 06-326443 | 11/1994 |
| JP | 11-177228 | 7/1999 |
| JP | 2000-169265 | 6/2000 |
| JP | 2004-022706 | 1/2004 |
| JP | 2004-22706 | 1/2004 |
| JP | 4031368 | 10/2007 |
| JP | 2010-272778 | 2/2010 |
| JP | 2011-66027 | 3/2011 |
| JP | 2011-066027 | 3/2011 |

* cited by examiner

METHOD FOR SHAPING A LAMINATE SUBSTRATE

BACKGROUND OF THE INVENTION

The present invention relates generally to a method for shaping a laminate substrate and more particularly to a method for shaping a laminate substrate prior to chip join.

High production flip chip organic composite laminate substrates are multi layer structures consisting of alternating layers of conductive metallurgy and dielectric. Dielectric layers may be particle filled organic dielectric (build-up layers) or particle and glass fiber filled organic dielectic (core). Laminate substrates may have length and width in the range of 20 mm to 75 mm, while thickness varies in the range of 0.3 mm to 3 mm. Individual build-up layer thicknesses are in the range of 15 um for copper, 33 um for build-up dielectric and 100 um to 1 mm for core. Laminate substrates have typical build-up dielectric coefficient of thermal expansion (CTE) values of 46 ppm/degree C., and core CTE values of 15 ppm/degree C. Next-generation materials have typical build-up dielectric CTE values of 20 ppm/degree C. and core CTE values of 12 ppm/degree C. Copper material used in composite laminate substrate fabrication is considered to have a CTE value of approximately 17 ppm over the temperature range of interest. Composite CTEs of laminate substrates are in the range of 15 ppm to 20 ppm. Room temperature dielectric loss tangent values of next generation laminate substrate materials are approx. 0.007, which are superior to current production laminates, which have loss tangent values of approximately 0.017.

Due to differential expansion and cure shrinkage of various composite laminate substrate materials during fabrication and use, laminate substrates are non-flat at most temperatures, but may approach a coplanar condition at a single temperature. In particular, laminate substrate silicon chip placement sites, due to high functional wiring density in that location, display strong thermal warpage tendencies over temperature. For best chip assembly yields, it is necessary to control the shape of the chip site during the assembly process. As the temperature of the laminate substrate varies widely during flip chip solder reflow assembly, the shape of the chip site also changes widely. It is necessary to control the shape of the chip site in a non-flat condition to produce a desired range of shapes at solder reflow chip join temperatures for best assembly yields.

Due to CTE mismatch between copper and build-up laminate substrate dielectric material and the usual interconnect structure employed to fan out the signals in a flip chip interconnect, many sequential build-up flip chip laminate substrates are concave at room temperature. These laminates may invert to a convex shape during heating from room to solder reflow temperature. Other laminates may be convex at room temperature and invert to concave with heating. Other laminates may be monotonically concave or convex over the temperature range of interest. The magnitude of warpage varies in all cases. Laminates may be convex over their full area, while a chip site area in the center for single chip laminates may be concave or convex. The shape of the laminate, particularly in the chip site area at soldering temperature, is critical to the joining process. In cases where laminates have cores with thicknesses less than 600 um, or are coreless, a flat chip site shape at joining temperature may be difficult to attain. Existing methods to achieve a flat laminate chip site shape at solder reflow temperature have not been successful.

SUMMARY OF THE INVENTION

In a first aspect of the invention, a method includes characterizing a laminate substrate for warpage characteristics over a range of temperatures. The method includes placing the laminate substrate into a shaping fixture with any necessary correction to obtain a flat laminate substrate chip site area shape at a chip join temperature. The method further includes shaping the laminate substrate at a temperature greater than or equal to a maximum laminate substrate fabrication temperature. The method also includes removing the laminate substrate from the fixture, wherein a shape of the laminate substrate is retained.

In a first aspect of the invention, a method includes characterizing a laminate substrate for full laminate and chip site area warpage characteristics at room, shaping process and chip join temperatures. The method includes determining an assembly process flow point for laminate substrate shaping. The method includes determining a shaping time and a thermal processing temperature. The method includes placing the laminate substrate into a shaping fixture with any necessary warpage correction to obtain a flat chip site area shape at the chip join temperature. The method further includes shaping the laminate substrate for the shaping time at the thermal processing temperature. The method also includes removing the laminate substrate from the fixture.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

This invention provides a method for shaping laminate substrates, such as flip-chip plastic ball grid array (FCPBGA) laminate substrates, during a thermal process, preferably the final maximum thermal cure process either during or after fabrication in a manner yielding a flat chip site shape at chip joining temperature. It has been determined that any laminate substrate dwell of sufficient duration regardless of temperature, while pressing or deforming the laminate substrate using a fixture, can produce a predictable and repeatable benefit. By shaping laminate substrates prior to chip join, the overhead for custom and part number unique fixturing or stiffeners in the chip join process may be eliminated. This pre-assembly shaping method does not require custom coining tooling per laminate substrate design and overcomes copper balance issues. Also, sorting and rejection of laminate substrates for defective shape is not required after forming.

Figure 8:
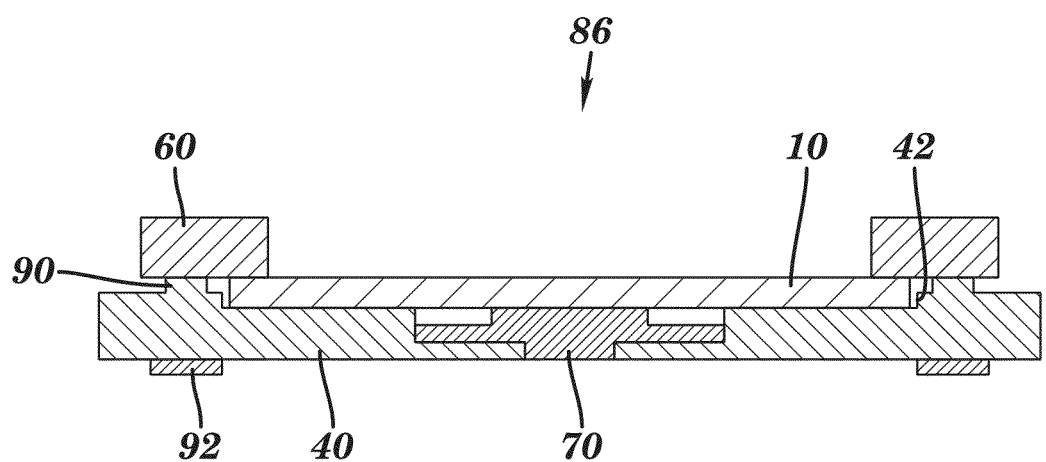
FIG. 8 is a side view of a fixture according to an embodiment of the invention.

It has been determined that laminate substrate dielectric materials, particularly cyanate ester epoxy based materials, are not completely cured during the laminate substrate fabrication process. In addition, these materials can be permanently deformed at temperatures above the glass transition temperature. Copper metal used in laminate substrate fabrication anneals at laminate substrate processing temperatures or below and can be semi-permanently forced into a desired shape without plastic deformation. Copper metal anneals at room temperature conditions, although at a reduced rate. As a result, it has been determined that at room or elevated temperature, clamping in a predetermined shape for sufficient time results in permanent or semipermanent deformation. Using a fixture 86 as shown in FIG. 8, or other fixtures, the laminate substrate may be forced into a desired shape which is retained after fixture removal and through preparatory steps for assembly, resulting in a flat chip site area during chip joining.

Figure 1:
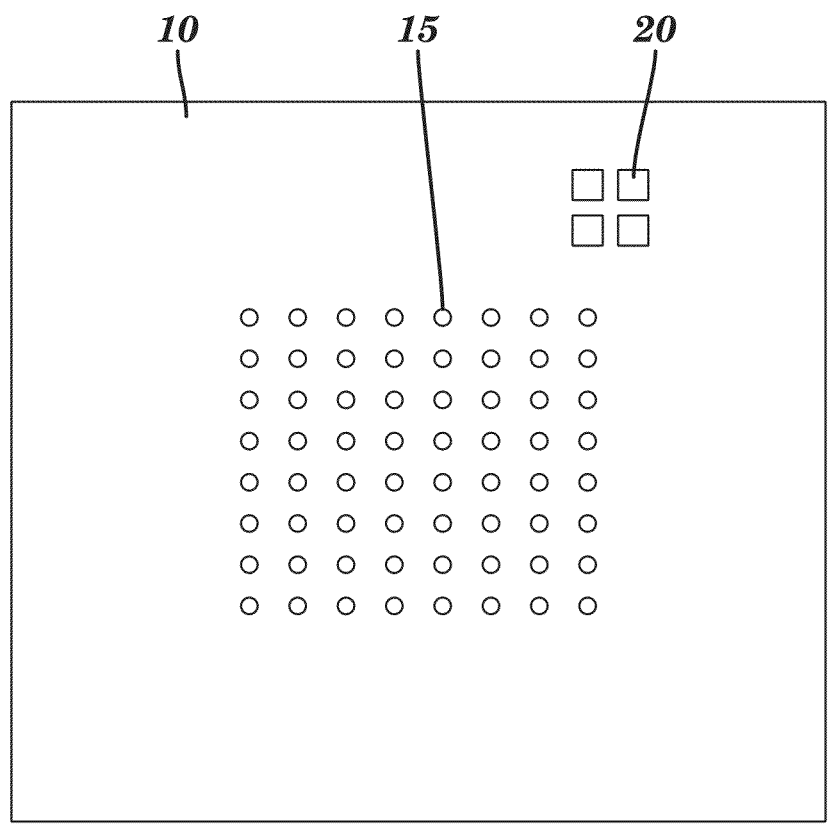
FIG. 1 shows a top view of a presolder bumped laminate substrate.

FIG. 1 shows a top view of a presolder bumped laminate substrate 10 having a presolder bumped chip site 15 and capacitor presolder bumps 20. Laminate substrate 10 is approximately 55 mm square, but could be larger or smaller. Presolder bumped chip site 15 is approximately 20 mm square, but could be larger or smaller. Presolder bump height may be approximately 20 um, but could be taller or shorter. Capacitor presolder bump height may be approximately 50 um, but could be taller or shorter.

Figure 2:
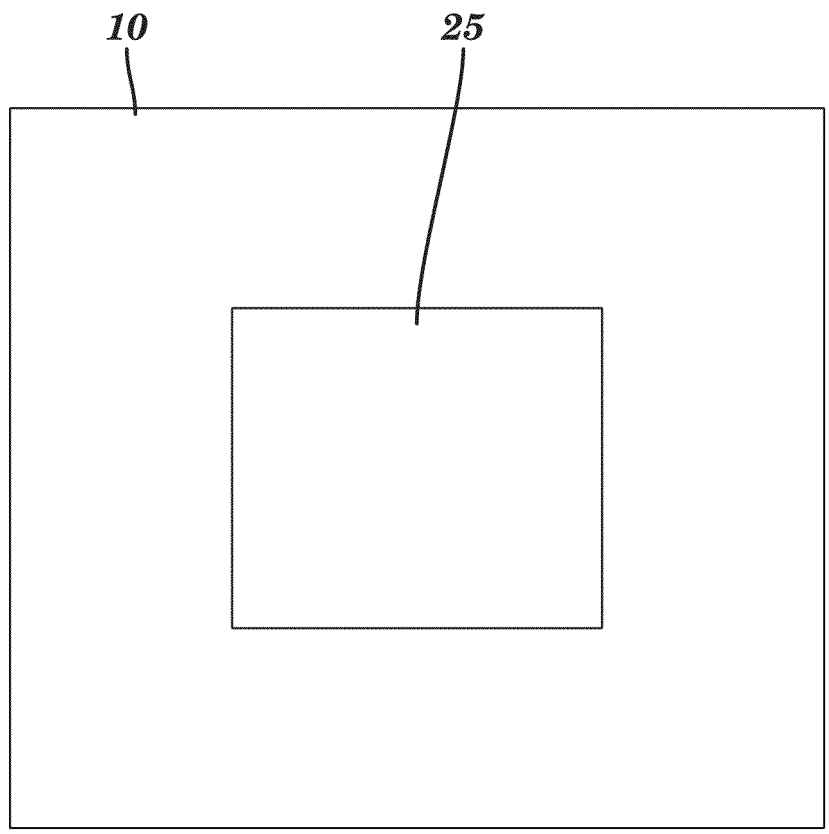
FIG. 2 shows a top view of a chip joined to the laminate substrate.

FIG. 2 shows a top view of a chip 25 joined to laminate substrate 10 at the presolder bumped chip site. Chip 25 is approximately 20 mm square, but could be larger or smaller. Chip 25 may be joined to laminate substrate 10 using conventional methods.

Figure 3:
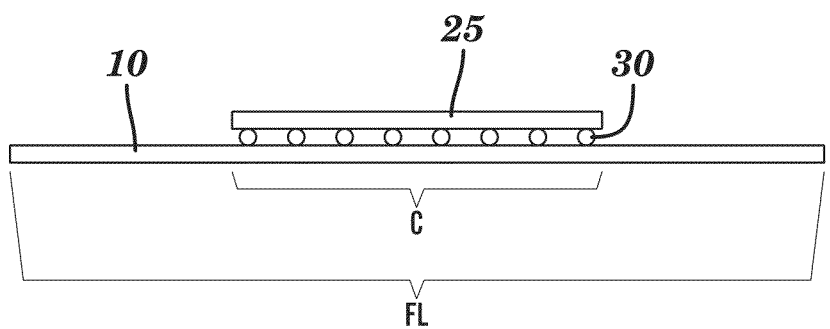
FIG. 3 is a side view of FIG. 2.

FIG. 3 shows a side view of FIG. 2. Laminate substrate 10 is approximately 1 mm thick, but could be thinner or thicker. Chip 25 is joined to laminate 10 with C4 solder balls 30. Reference letter C denotes a chip site warpage measurement area. Typical chip site warpages are up to 50 um and may be convex or concave at room temperature, but are generally concave at the chip interface. Reference letter FL denotes a full laminate warpage measurement area. Typical full laminate warpages are approximately 50 um to 200 um and may be convex or concave at room temperature.

Referring to FIGS. 4-8, a fixture 86 according to an embodiment of the invention includes a base plate 40, a trap ring 60 and a center button 70. The fixture 86 may be used for controlling the shape of the laminate substrate 10 to produce an optimum shape over the range of chip join temperatures. The base plate 40 may be a flat plate larger in two horizontal dimensions than the laminate substrate 10. In the vertical direction, the base plate 40 has sufficient thickness to be substantially free from out of horizontal plane distortion down to micron levels resulting from thermal expansion over the temperature range of interest, from room temperature to solder joining temperature. The base plate 40 may be formed with a recess 42 on one side, which approximately positions the laminate substrate 10 within the fixture. The recess 42 is larger than the laminate substrate 10 in the horizontal plane. The recess 42 is sized such that it does not constrain the thermal expansion of the laminate substrate 10 over the temperature range of interest, considering both the thermal expansion of the base plate 40 and that of the laminate substrate 10. The depth of the recess 42 may vary from only that required for positioning of the laminate substrate 10, approximately 0.1 mm, to equal or greater than the thickness of the laminate substrate. The base plate 40 may be formed with a through opening 45 in the center positioned such that it is centered on the laminate substrate 10 largely within the chip site area. The opening 45 may contain features enabling mating with a center button 70 such that the height of the center button 70 is adjustable with a high degree of precision, in the range of 10 um.

Figure 14:
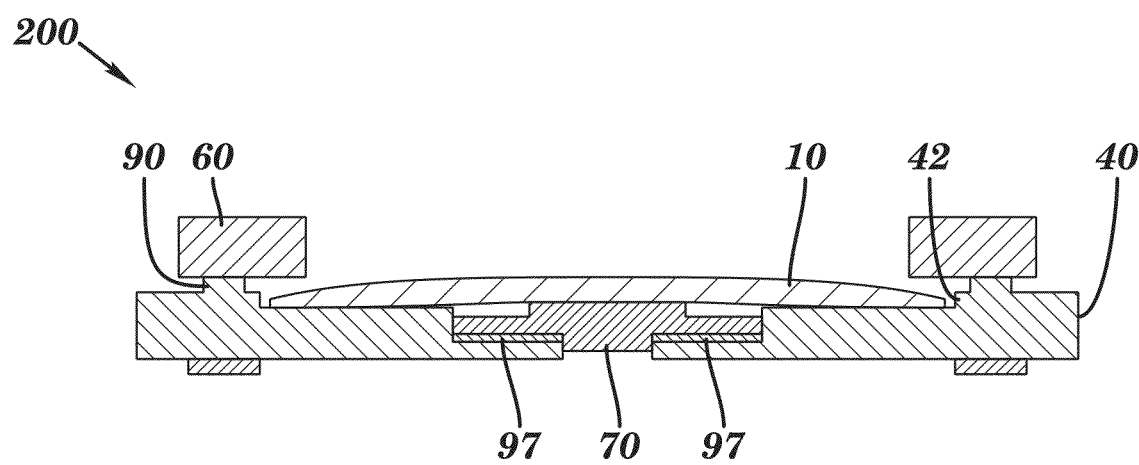
FIG. 14 is a side view of a laminate substrate in a fixture according to an embodiment of the invention.

Referring to FIGS. 7A-7D, these features may be a stepped structure with a flat top 70 or a ring top 72, enabling the use of controlled thickness shims 97 as shown in FIG. 14 for height adjustment, or a threaded structure with a flat top 80 or a ring top 82, such that height may be adjusted by rotation of the center button, or by other similar means. Alternatively, the center button 70 may be an integral part of the base plate 40 of a fixed height. The recess 42 in the base plate 40 has an area coplanar to the limit of fabrication capability at its peripheral surface. The recess 42 may be fully coplanar for the majority of its perimeter over a narrow band enabling the capture of the laminate substrate edge over the entire temperature range of interest considering differential expansion. This coplanar band width may be in the range of about 0.5 mm to about 5 mm, or larger.

Figures 5A, 5B:
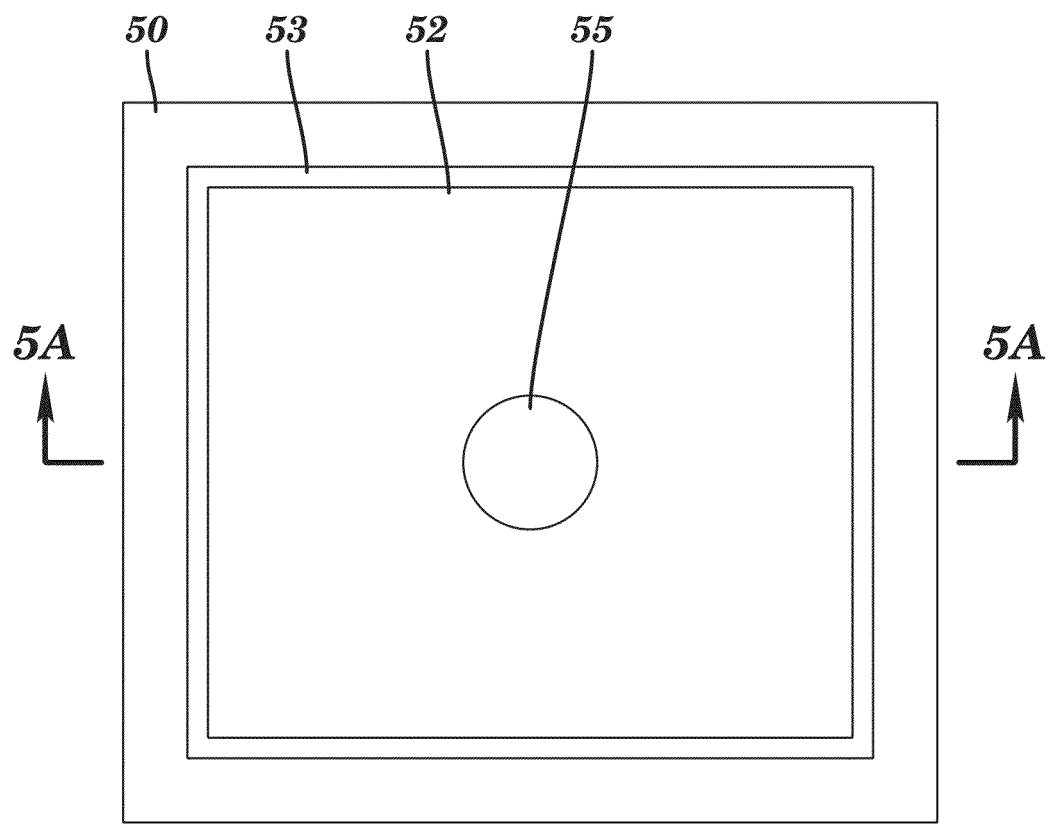
FIG. 5A is a top view of a base plate according to another embodiment of the invention.
FIG. 5B is a side view of FIG. 5A.
Figure 7A:
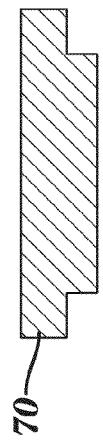
FIGS. 7A-7F are side and top views respectively of a center button according to various embodiments of the invention.
Figure 7B:
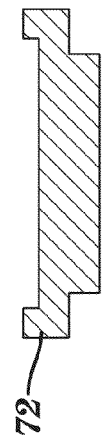
Figure 7E:
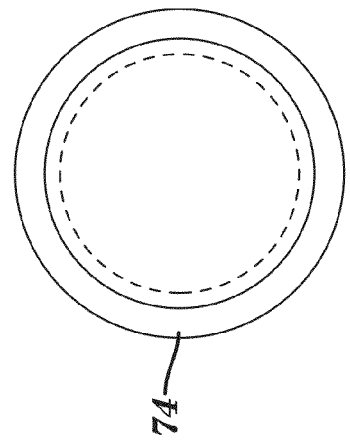
Figure 7C:
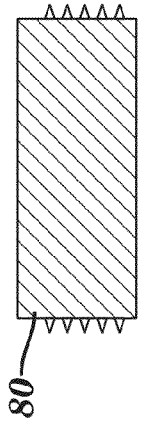
Figure 7D:
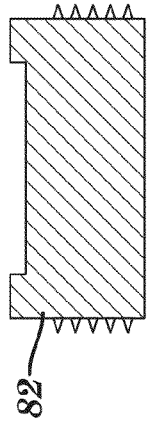

Referring to FIGS. 5A-5B, according to another embodiment of the invention, an alternative base plate 50 may include cavities 53, outside of the coplanar band, formed in a base plate recess 52 to provide clearance for protrusions such as presolder deposits on the laminate substrate surface, such that the laminate substrate surface is entirely supported by the base plate 50 rather than any protrusions. Base plate 50 may be formed with a through opening 55 in the center positioned such that it is centered on the laminate substrate largely within the chip site area. The opening 55 may contain features enabling mating with a screw adjustable center button 70 such that the height of the center button 70 is adjustable with a high degree of precision, in the range of 10 um. Referring to FIGS. 7C-7D, these features may be a threaded structure with a flat top 80 or a ring top 82, such that height may be adjusted by rotation of the center button, or by other similar means.

Figure 4A:
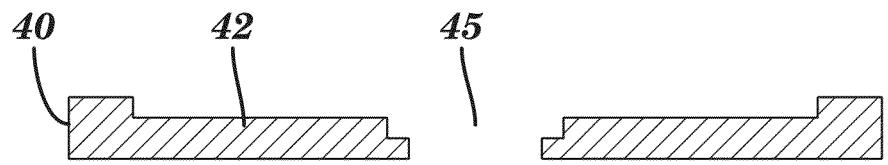
FIG. 4A is a top view of a base plate according to an embodiment of the invention.
Figure 4B:
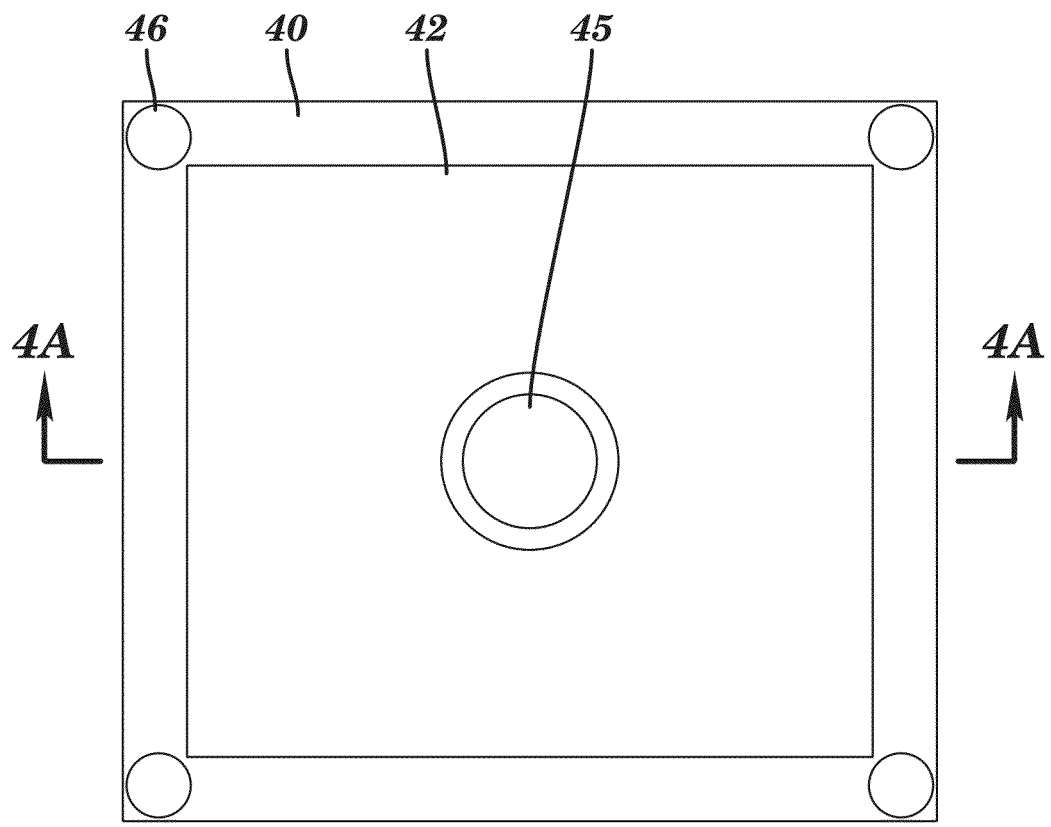
FIG. 4B is a side view of FIG. 4A.
Figure 6:
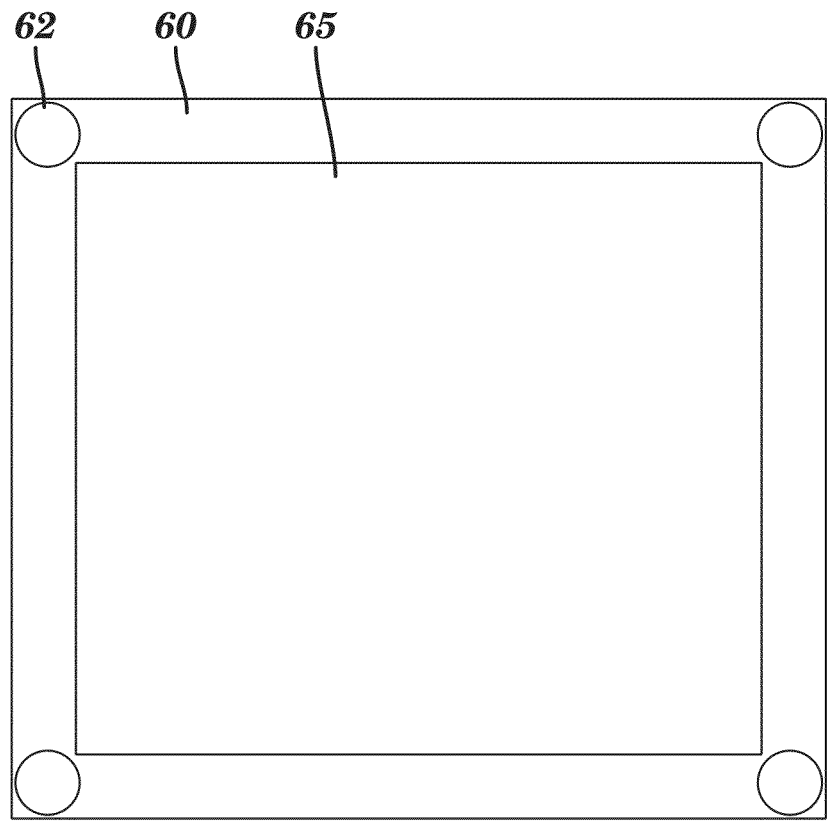
FIG. 6 is a top view of a trap ring according to an embodiment of the invention.

Referring to FIG. 6, the trap ring 60 may be a frame sized to mate with the base plate 40, capturing the laminate 10 at the substrate periphery. The trap ring 60 may include an opening 65. The trap ring 60 width may be narrow such that it constrains the warpage shape of the laminate substrate 10 only at its periphery in the area of the base plate coplanar band. The laminate substrate 10 is fully constrained flat at its periphery over the entire temperature range of interest. The width of the trap ring 60 capturing the substrate periphery may be in the range of 0.5 mm to 5 mm, more or less. Trap ring 60 may contain openings 62 for inserting locating features 90 (as shown in FIG. 8) into alignment holes 46 of the base plate 40 (as shown in FIG. 4B).

The trap ring 60 may be aligned with the base plate 40 by locating features 90 such as dowel pins, a base plate recess depth greater than the laminate substrate and trap ring protrusion into that recess or by other positioning features. The trap ring 60 is coplanar and substantially free of distortion over the temperature range of interest. The trap ring 60 and base plate 40 are fabricated such that movement and distortion of the laminate substrate 10 in the height direction in the coplanar band area are entirely constrained over the temperature range of interest. Outside of the coplanar band area the laminate substrate 10 is free to distort in the height dimension away from the base plate 40, while constrained by the base plate against movement downward. The force exerted by the trap ring 60 against the laminate 10 and base plate coplanar band is limited to the range of none to a few kilograms to enable lateral movement of the laminate in the horizontal direction during thermal expansion.

Figure 7F:
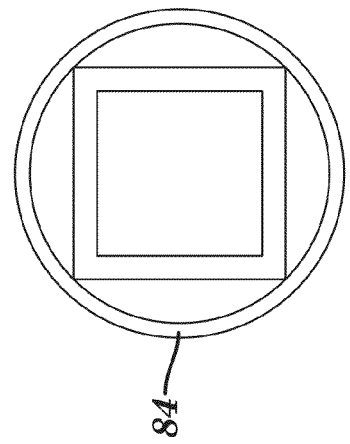

The center button 70 presents a substantially coplanar surface to the bottom of the laminate substrate 10 over a limited area in its center. Referring to FIGS. 7E-7F, this area may be round 74 or rectangular 84 in shape and may be less than, equal to, or greater than the laminate substrate chip site area as needed. The center button coplanar surface may be a narrow ring entirely outside the chip site area such that minimal substrate surface is contacted by the ring, permitting substrate protrusions such as solder deposits both inside and outside the chip site area without affecting the vertical height control of the substrate surface by the center button. Alternatively, the center button may be substantially flat over its entire top surface, and may contact either the laminate substrate surface or protrusions such as solder deposits as needed for vertical height control. The center button contains features for location and vertical height adjustment within the base plate such as screw threads 80, 82 or a stepped shape 70, 72 permitting the use of shims 97. When assembled in the base plate 40, the height of the center button coplanar surface may be adjustable independently of the base plate in the range of 0 to 200 um as needed to produce the desired laminate shape result.

Referring to FIG. 8, in use, the center button 70 may be assembled to the base plate 40 with vertical height adjusted to an ideal level determined by experiment or modeling. The laminate substrate 10 is oriented and placed within the recess 42 of the base plate 40, positioned approximately by that recess. The trap ring 60 may be assembled over the laminate substrate 10, positioned by its locating features 90. A controlled load may be imposed on the trap ring 60 by some means, such as a clamping feature, a force controlled spring or a weight under the influence of gravity, forcing the laminate substrate periphery into a coplanar condition against the base plate recess coplanar band. This load must be limited to the magnitude required to attain a laminate substrate coplanar condition while permitting the laminate substrate to move readily in the horizontal direction due to differential thermal expansion, eliminating height distortion of the laminate substrate during fixture use due to constraints on horizontal movement. For typical applications using laminate substrates with layer counts in the 6 to 14 metal layer range, the load applied to the laminate may be in the range from a low of zero to several kilograms or more. Base plate 40 may include a plurality of feet 92.

Fixture 86 provides constraint to a coplanar shape in one height direction. Fixture 86 provides freedom to move out of plane in a controlled manner in the other height dimension. Fixture 86 provides freedom to expand in the horizontal direction thermally without constraint such that out of plane distortion is not caused by constrained horizontal thermal expansion.

Figure 9:
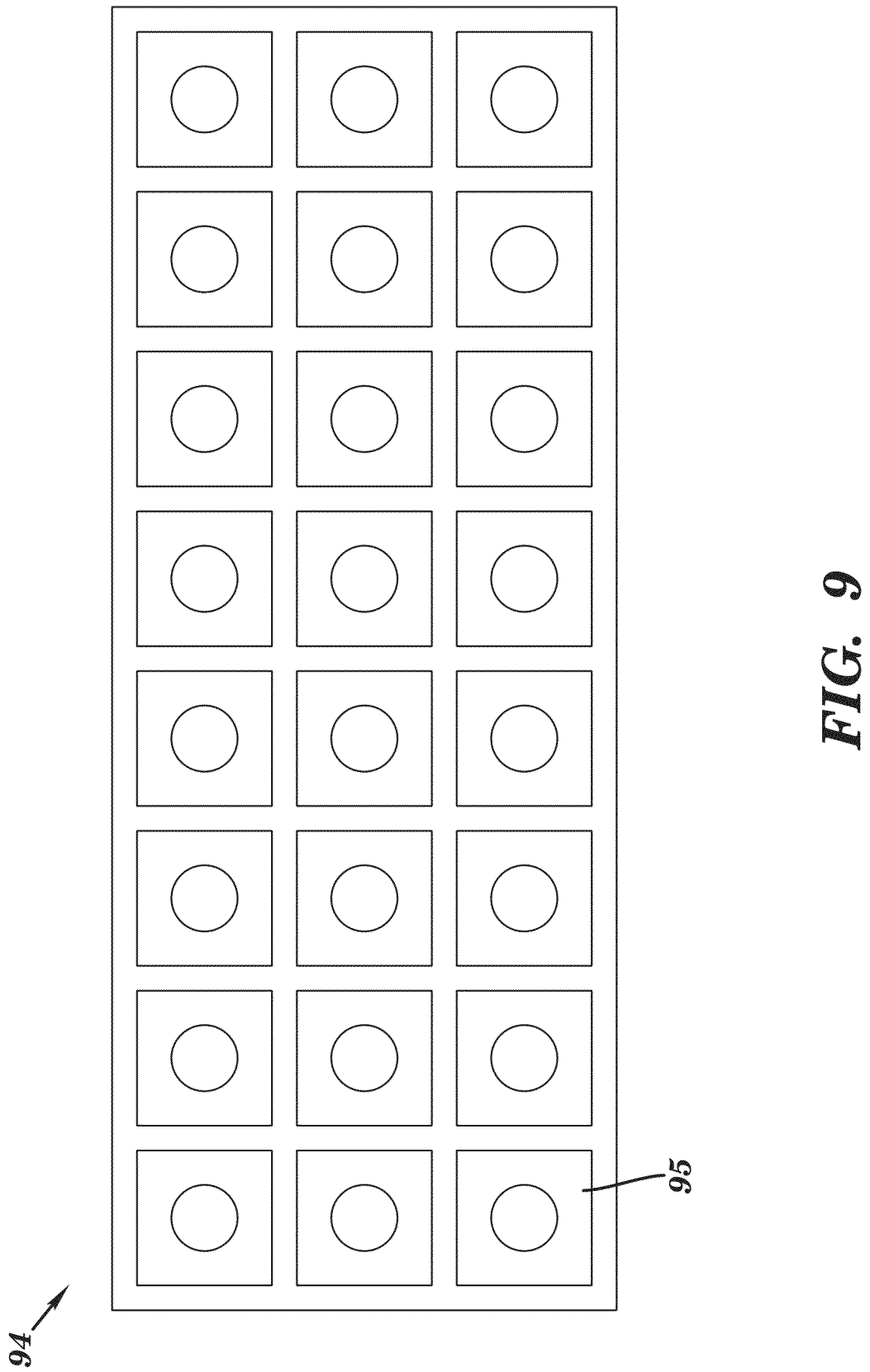
FIG. 9 is a top view of an array or panel size fixture implementation.
Figure 10:
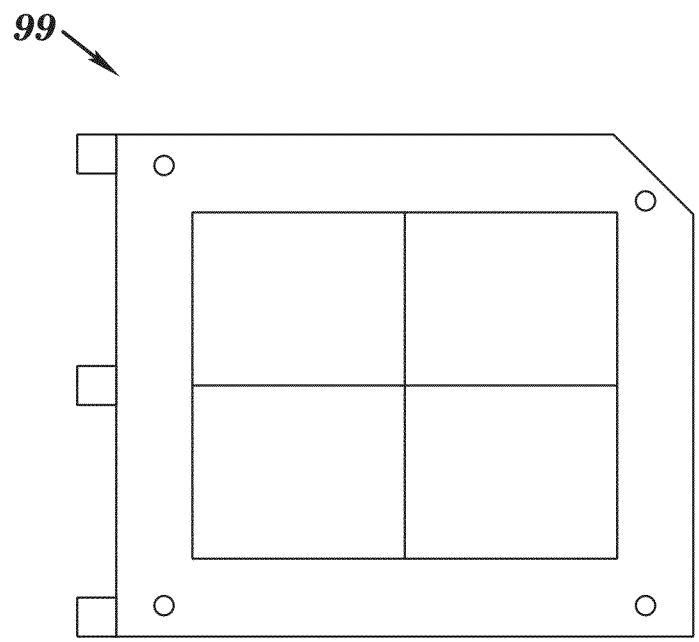
FIG. 10 is a top view of a 4-up fixture configuration.

In mass production, a fixture may be used singly as previously described or in an array 94 or panel size format as shown in FIG. 9 where the array may be in the size of 10 or more fixture pockets 95. FIG. 10 shows a top view of a 4-up fixture configuration 99 according to an embodiment of the invention.

Figure 11:
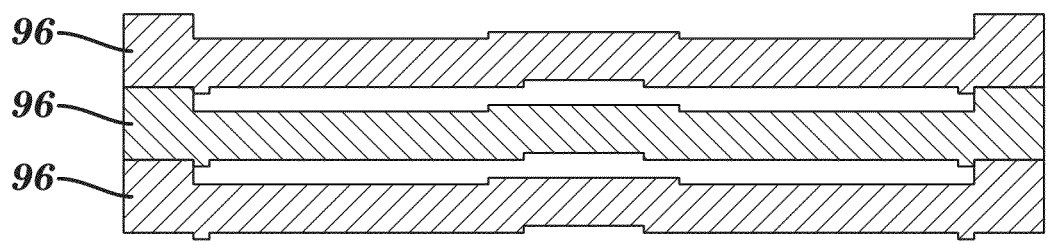
FIG. 11 is a side view of a fixture implementation in stackable trays.

The fixture center button may remain adjustable or may be fixed to an appropriate height as previously determined. The trap ring may remain single, or be in an array format of the size of the fixture pocket. A bottom of a base plate may be formed to perform the function of the trap ring such that fixtures are stackable trays 96 as shown in FIG. 11. The required load may be imposed by the fixture stack. Stackable fixtures may meet the requirements of JEDEC Publication 95 Design Guide 4.10, "Generic Shipping and Handling Matrix Tray", and be otherwise used for shipping and handling of laminate substrates. Fixture material may be metal, polymer, or composite, with the primary requirements that the material and structure be free of thermal distortion over the temperature range of interest, and not contaminate or otherwise degrade the laminate substrate during use. Laminate substrates may be fabricated in an array format in panel form, where panels may be as large as 0.5 meters×0.7 meters. During processing, these panels may be reduced to sub panels of a fraction of original panel size. The laminate shaping fixture may be developed for application at the panel or sub panel level, where the pocket applies to the full area, and trap ring and center button apply to individual laminates and chip sites within the panel.

Figure 12:
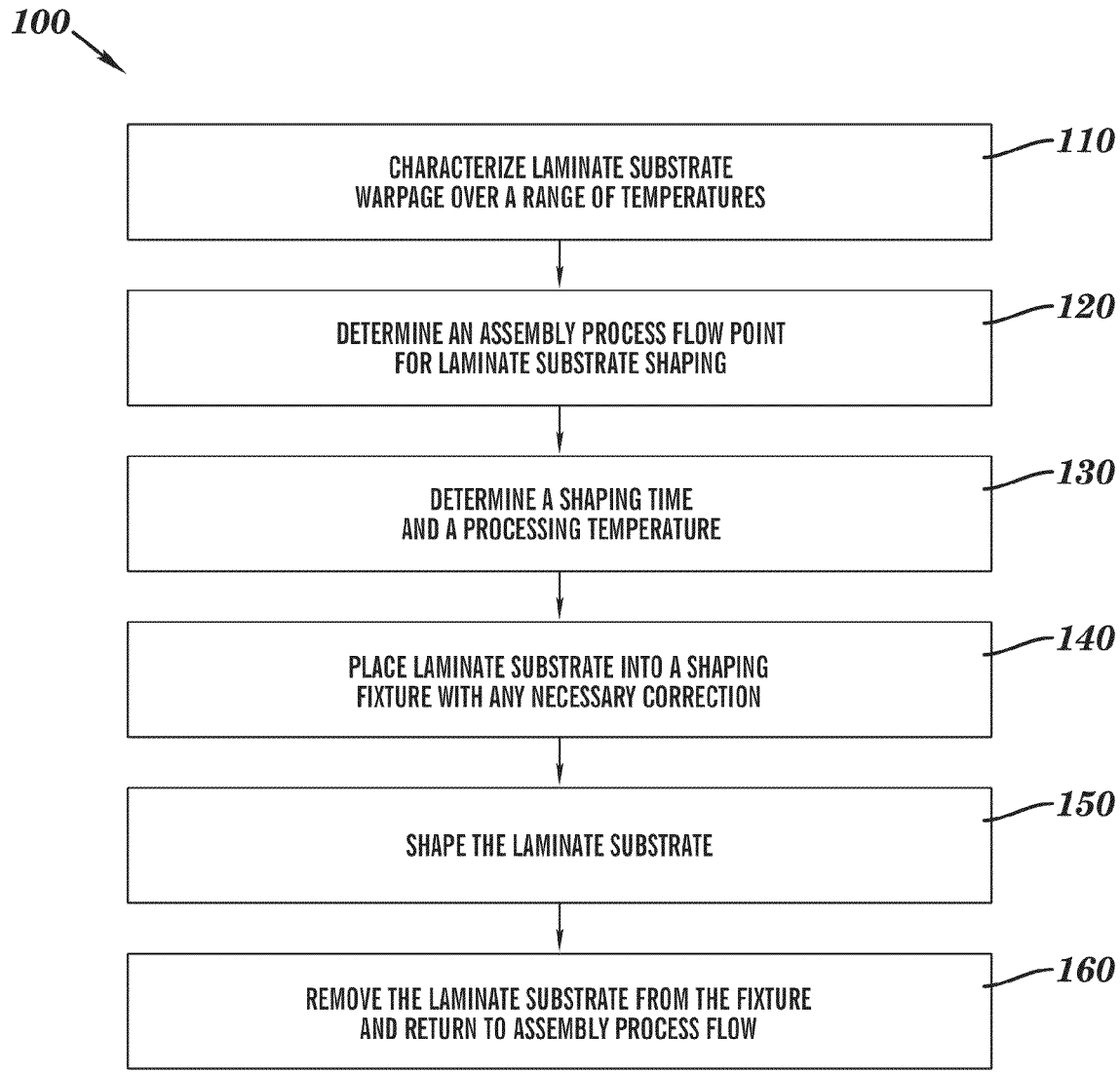
FIG. 12 is a flow chart for process steps according to an embodiment of the invention.

FIG. 12 shows a flow chart 100 for process steps according to an embodiment of the invention. In step 110, laminate substrates are characterized for warpage characteristics over a range of temperatures, such as room, shaping process and chip join temperatures, using digital image correlation (DIC) as shown in FIGS. 13A-13F. Other thermal imaging techniques, such as shadow moiré, may also be used to characterize the laminate substrates. For a given laminate substrate design or cross section (stack up of copper and dielectric materials of specified thickness) a normal or typical laminate substrate shape is determined for each of a specified range of temperatures. This normal shape may be determined over a statistically significant number of laminate substrates representative of the variations in the production process, including typical variations over time. Warpage shape may be characterized for both the full laminate and laminate chip site area over the range of temperatures of interest, such as 25 degree C. room temperature, 125 degree C. shaping process and 245 degree C. chip join, as shown in FIGS. 13A-13F, or other temperatures. Of greatest concern is the shape of the chip site area which must be manipulated to the desired condition at temperature. The shape of the laminate periphery is of interest primarily due to its ability to influence the laminate chip site shape.

In step 120, an optimum assembly process flow point for laminate substrate shaping is determined. Typical processing flow point areas may include, but are not limited to final cure, prepackaging dry bake, shipping or pre-assembly dry bake. A thermal process may also be implemented solely for the purpose of laminate substrate shaping.

In step 130 shaping time and processing temperature are determined. A processing temperature may be determined for laminate substrate shaping either by experiment, or by consideration of shaping opportunities within the production process. Shaping may be performed at lower temperatures for longer duration or at higher temperature for shorter duration. The normal laminate substrate shape change (thermal warpage) between the proposed shaping process temperature and the assembly chip join temperature may be extracted from DIC or shadow moiré measurement results by subtraction. In addition to permanent or semi-permanent laminate substrate shape change through processing, typical laminate substrate relaxation or spring back on removal from the shaping fixture may be determined experimentally and compensated for in shaping fixture setup. Thus, the fixture will correct the laminate substrate warpage at chip join temperature by forcing a predetermined shape at the shaping process temperature which also compensates for laminate substrate relaxation upon release from the fixture.

Figure 13A:
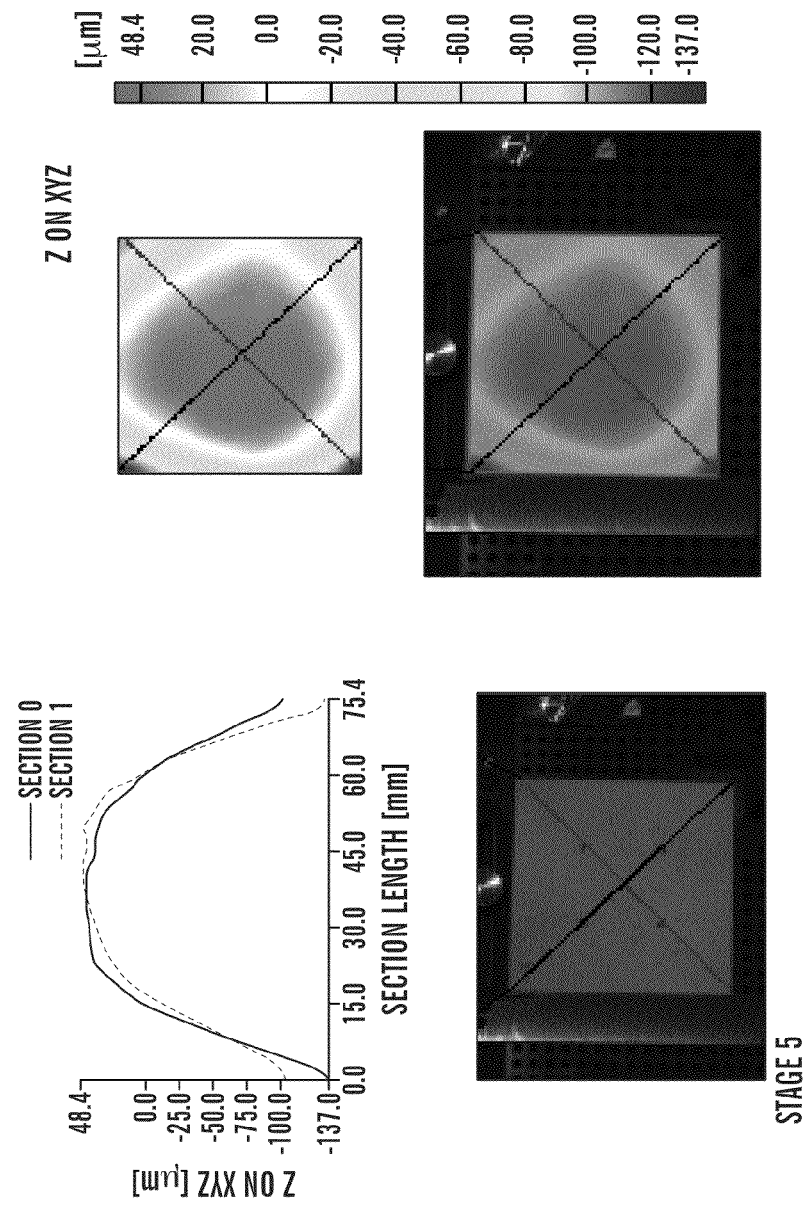
FIGS. 13A-13F show laminate substrate warpage over the full laminate and at the chip site area, at room, shaping process and joining temperatures using digital image correlation (DIC)
Figure 13B:
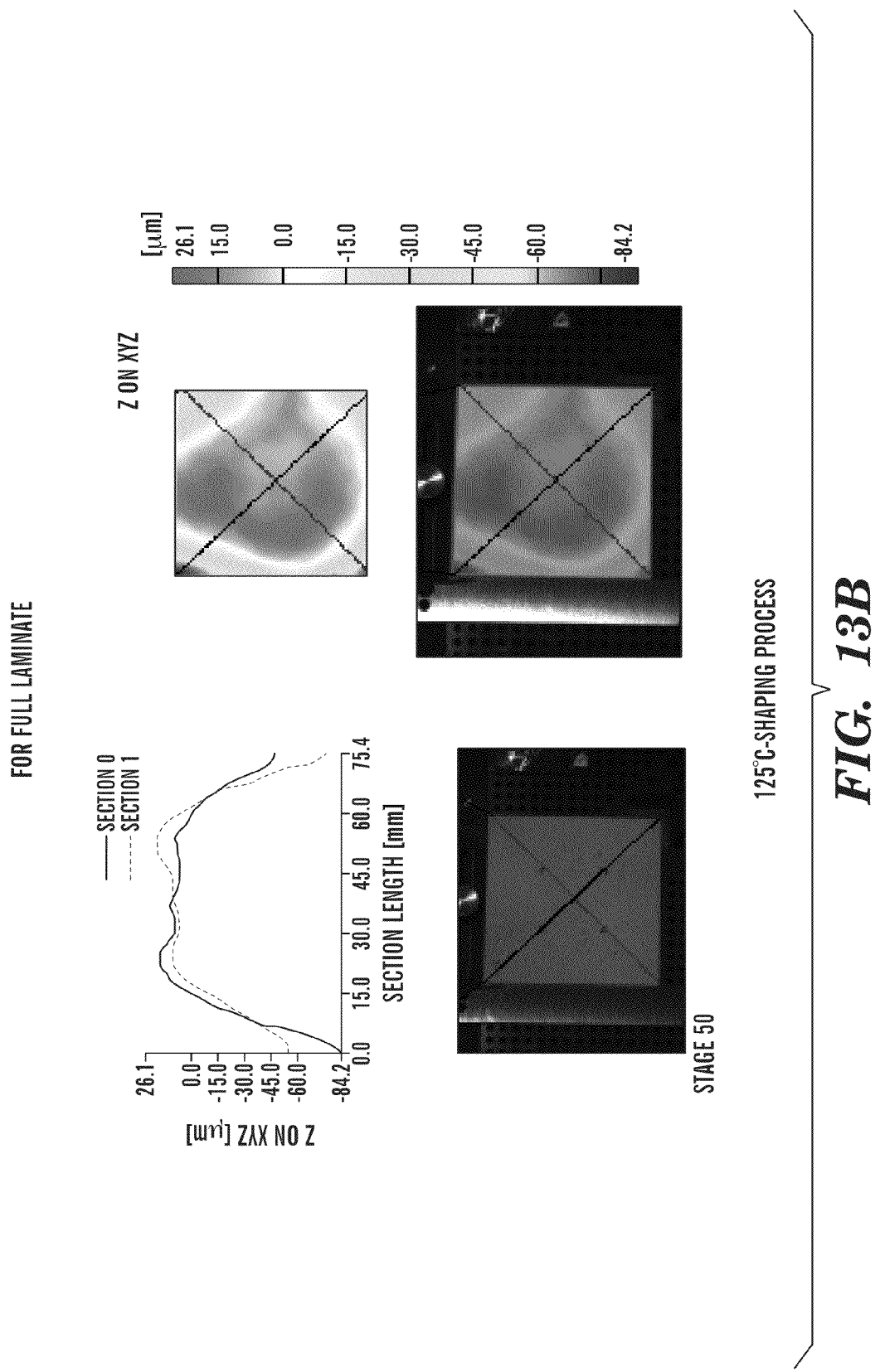
Figure 13C:
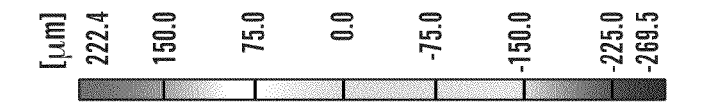
Figure 13C:
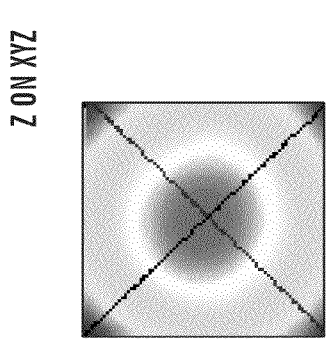
Figure 13C:
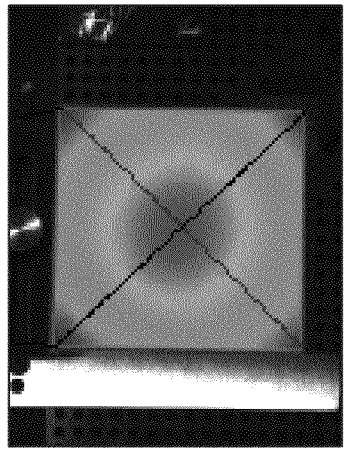
Figure 13C:
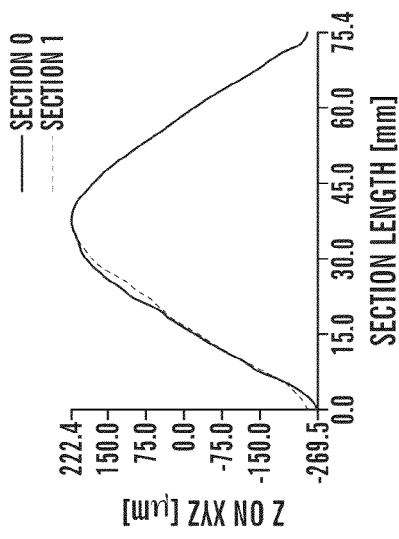
Figure 13C:
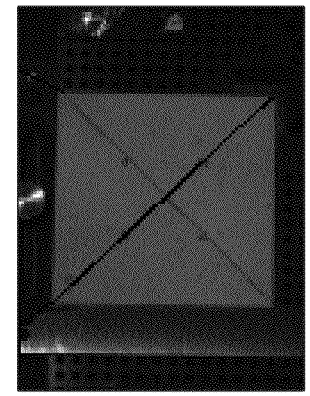
Figure 13D:
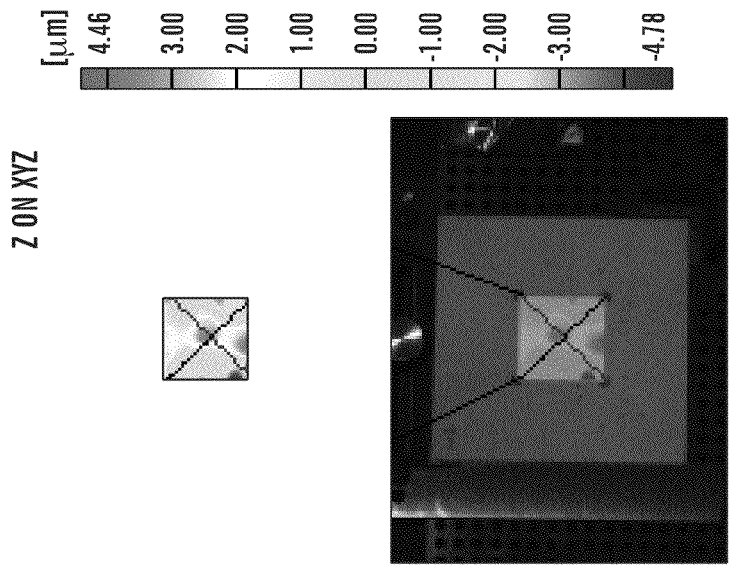
Figure 13D:
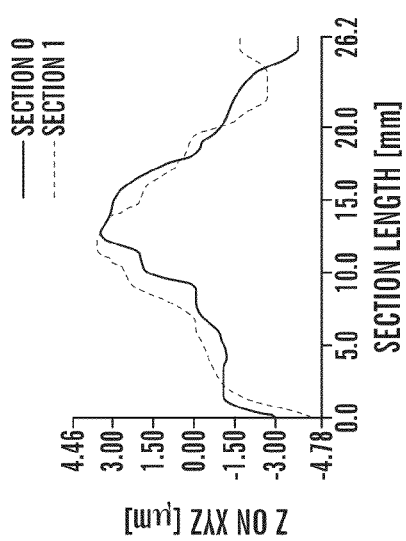
Figure 13E:
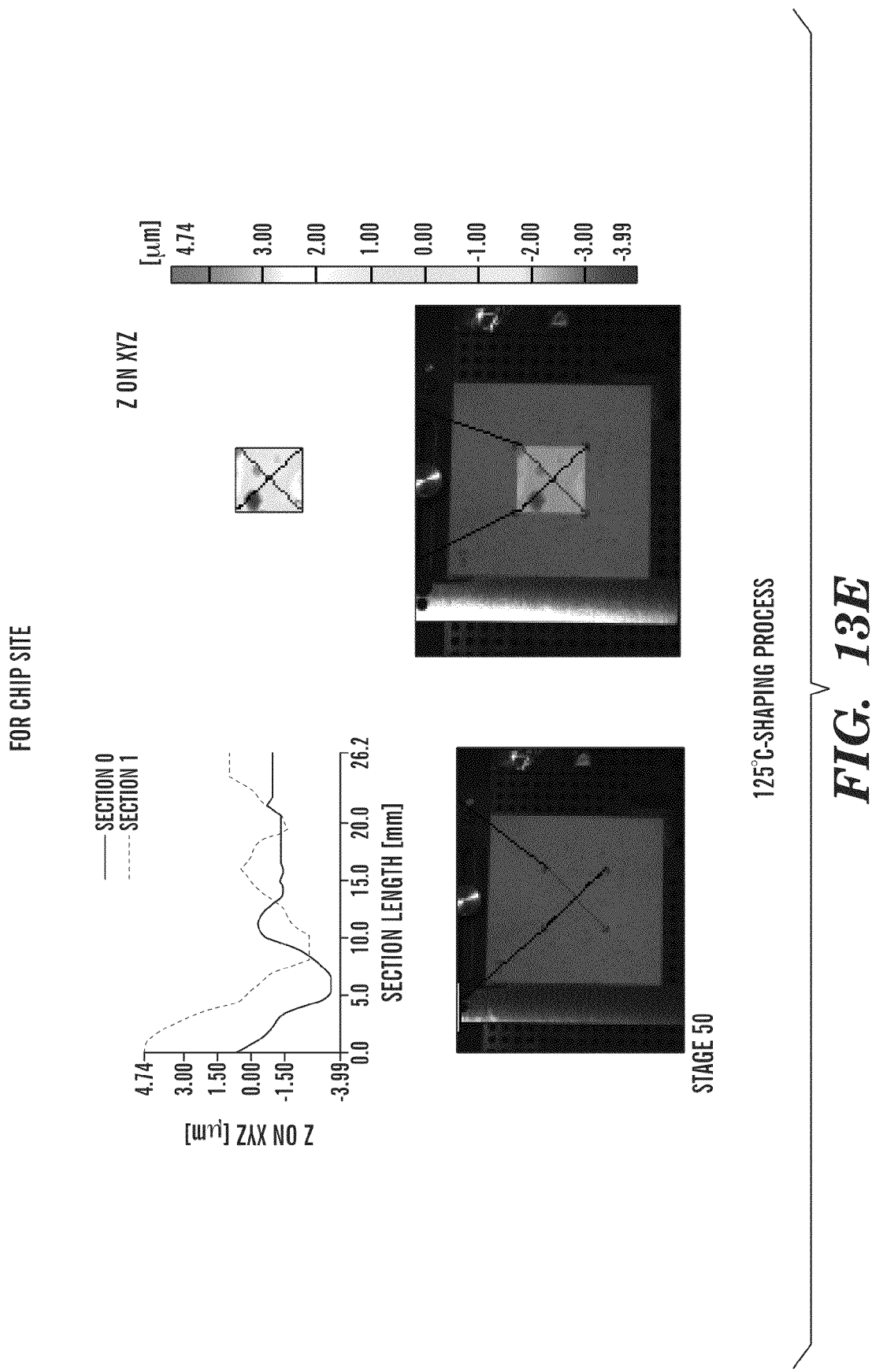
Figure 13F:
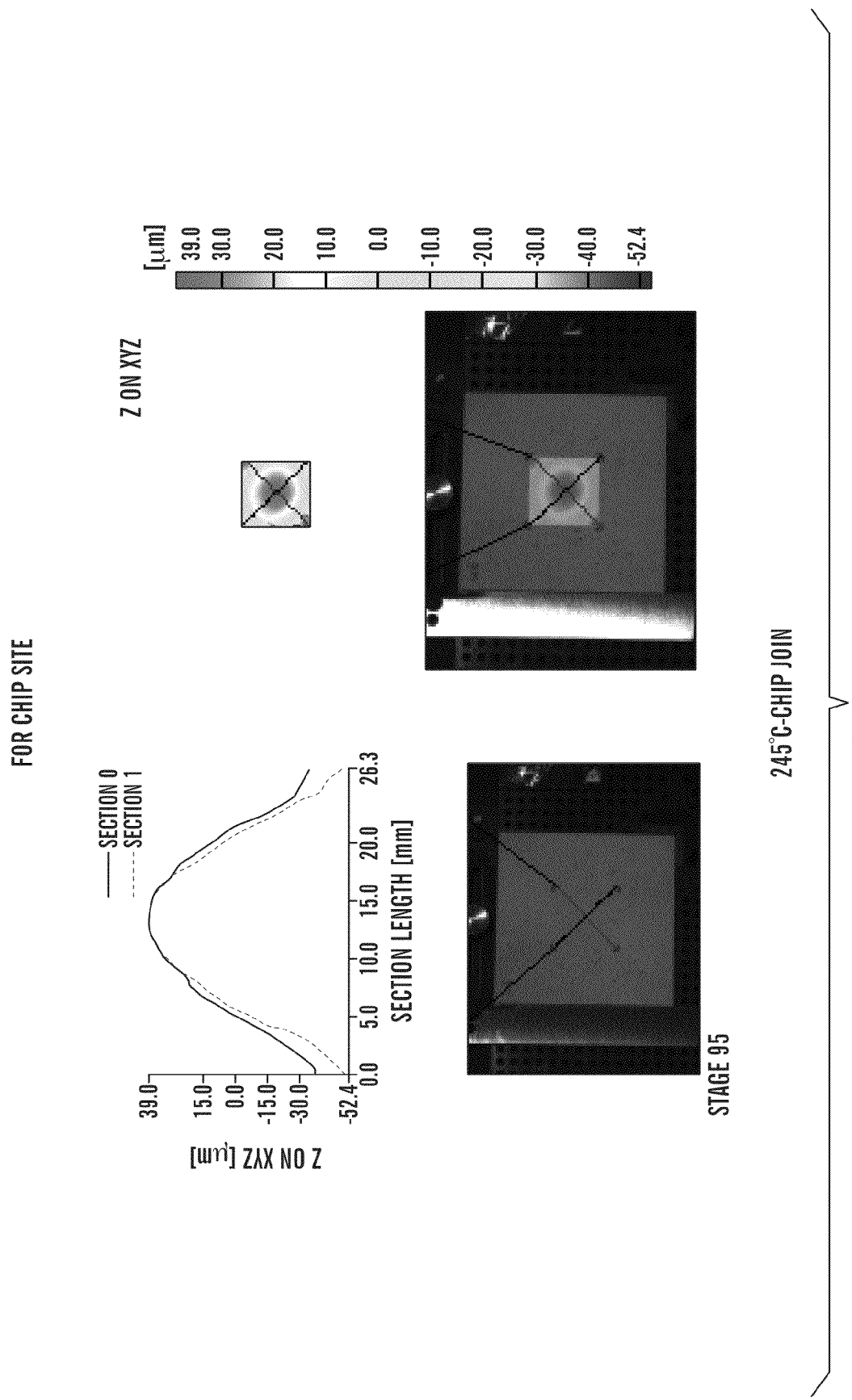

In step 140 the laminate substrate is placed into the shaping fixture with any necessary correction, such as the number of shims 97 required in shaping fixture 200 as shown in FIG. 14 (or height of a threaded button). The shims may be used in a given fixture corresponding to a given laminate or group of laminates. The fixture configuration may be 1-up, 4-up, 10-up and the like. The shaping fixture may be adjusted to compensate for the difference between the usual laminate substrate shape at joining temperature and a flat chip site condition. Based on warpage characterization by DIC or shadow moiré, or determined by experiment, it is determined if center button 70 is required in the fixture to achieve the desired laminate substrate shape. It has been determined that where overall laminate substrate warpage is large and monotonic outside the chip area (following a continuous curve), the laminate substrate warpage shape will invert when clamped by the base plate 40 against the trap ring 60, achieving the desired conditioning shape without the use of center button 70. Where overall laminate warpage is small or complex in shape, a center button may be required. The orientation of the laminate substrate in the fixture (die side up or die side down) may be determined in either case. Adjustment is made to the height of the center button 70 as needed. Referring to FIG. 13E, the chip site is concave by about 10 um at the shaping process temperature. At the chip join temperature, the chip site is convex by about 80 um as shown in FIG. 13F. The fixture may be configured as shown in FIG. 14 to obtain a flat shape at chip join temperature. It has been determined in this case that spring back from shaping by an 8 hour bake at 125 degree C. is approximately 20 um. In addition to center button height, other shaping parameters such as chip site side up or chip site side down may be established to cancel joining temperature laminate substrate warpage. Center button height or inverted laminate center distance from the base plate is typically in the range of 0-150 um for cored and coreless laminates in the range of 8-12 metal layers. The fixture may be single or array type. The laminate substrates may be singulated or in panel form. The laminate substrates are loaded into the preset shaping fixture and submitted to the shaping process, which may vary widely in temperature and duration.

In step 150 the laminate substrate is shaped using the predetermined time and processing temperature conditions of step 130. Typical process times at temperatures significantly below solder reflow temperatures may be in the range of about 1 to 8 hours, but could be longer or shorter. Shaping process temperatures may be in the range from about 23 degree C. to 200 degree C., but could be higher or lower. Shaping may be performed in an oxygen free environment to preserve the condition of surface finish on both copper and solder mask surfaces. JEDEC style shipping trays may have shaping features incorporated into their design and may be used to shape laminates over extended duration in shipping and storage at room temperature.

In step 160, at an appropriate point in the assembly process, the laminate substrate is removed from the fixture after it is shaped and returned to the assembly process flow. The laminate substrate continues unconstrained through chip join and module assembly. The time and temperature allowable for shape retention prior to assembly is strongly dependant on the time and temperature used for the shaping condition. It has been determined that higher temperatures and longer dwells lead to a more permanent deformation, while lower temperatures and shorter dwells lead to a temporary deformation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method, comprising:
characterizing a plurality of laminate substrates for warpage characteristics over a range of temperatures to determine a typical laminate substrate shape at each temperature range;
based upon characterizing the plurality of laminate substrates, determining if a center button is included within a shaping fixture;
placing a subsequent laminate substrate into the shaping fixture with any necessary adjustment of the center button to obtain a flat laminate substrate chip site area shape at a chip join temperature;
shaping the subsequent laminate substrate at a temperature greater than or equal to a maximum laminate substrate fabrication temperature; and
removing the subsequent laminate substrate from the fixture, wherein a shape of the subsequent laminate substrate is retained.

2. The method according to claim 1, wherein the plurality of laminate substrates are characterized by using digital image correlation (DIC).

3. The method according to claim 1, wherein the plurality of laminate substrates are characterized by using shadow moiré.

4. The method according to claim 1, further comprising characterizing chip site areas of the plurality of substrates for warpage characteristics to determine a typical chip site shape at each temperature range.

5. The method according to claim 1, wherein the range of temperatures includes a plurality of temperature ranges from 25 degree C. to 245 degree C.

6. The method according to claim 1, wherein the shaping the subsequent laminate substrate is performed in an oxygen free environment.

7. The method according to claim 1, further comprising determining an orientation of the subsequent laminate substrate in the shaping fixture.

8. The method according to claim 7, wherein the orientation is chip site area down.

9. The method according to claim 7, wherein the orientation is chip site area up.

10. A method, comprising:
characterizing a plurality of laminate substrates for full laminate and chip site area warpage characteristics at room, shaping process and chip join temperatures to determine typical full laminate and chip site area shapes at each room, shaping process and chip join temperatures;

based upon characterizing the plurality of laminate substrates, determining if a center button is included within a shaping fixture, determining an assembly process flow point for laminate substrate shaping and, determining a shaping time and a thermal processing temperature;

placing a subsequent laminate substrate into the shaping fixture with any necessary adjustment of the center button to to obtain a flat chip site area shape at the chip join temperature;

shaping the subsequent laminate substrate for the shaping time at the thermal processing temperature; and removing the subsequent laminate substrate from the fixture.

11. The method according to claim 10, wherein the plurality of laminate substrates are characterized by using digital image correlation (DIC).

12. The method according to claim 10, wherein the plurality of laminate substrates are characterized by using shadow moiré.

13. The method according to claim 10, wherein the shaping time is in a range from about 1 to about 8 hours.

14. The method according to claim 10, wherein the shaping process temperature is in range from about 23 degree C. to about 200 degree C.

15. The method according to claim 10, wherein shaping the subsequent laminate substrate is performed in an oxygen free environment.

16. The method according to claim 10, further comprising determining an orientation of the subsequent laminate substrate in the shaping fixture.

17. The method according to claim 16, wherein the orientation is chip site area down.

18. The method according to claim 16, wherein the orientation is chip site area up.

* * * * *